(12) United States Patent
Sun

(10) Patent No.: US 6,353,361 B1
(45) Date of Patent: Mar. 5, 2002

(54) FULLY DIFFERENTIAL TWO-STAGE OPERATIONAL AMPLIFIER WITH GAIN BOOSTING

(75) Inventor: Runhua Sun, Tustin, CA (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/746,756

(22) Filed: Dec. 20, 2000

Related U.S. Application Data

(60) Provisional application No. 60/224,602, filed on Aug. 11, 2000.

(51) Int. Cl.[7] ................................................ H03F 3/45
(52) U.S. Cl. ...................................... 330/253; 330/310
(58) Field of Search .................................. 330/253, 310

(56) References Cited

U.S. PATENT DOCUMENTS

| | | | |
|---|---|---|---|
| 5,748,040 A | * 5/1998 | Leung | 330/253 |
| 6,127,891 A | * 10/2000 | Eschauzier et al. | 330/255 |
| 6,150,883 A | * 11/2000 | Ivanov | 330/253 |

OTHER PUBLICATIONS

Kelvin Boo–Huat Khoo, "Programmable, High–Dynamic Range Sigma–Delta A/D Converters for Multistandard, Fully–Integrated RF Receivers," Dec. 1998, pp. 54–69.

* cited by examiner

Primary Examiner—Robert Pascal
Assistant Examiner—Henry Choe
(74) Attorney, Agent, or Firm—Thomas, Kayden, Horstemeyer & Risley

(57) ABSTRACT

A differential, two-stage op-amp circuit comprised of a plurality of electrically connected MOSFET's and including a telescopic op-amp circuit integrated with gain-boost amplifier circuits in the input stage and a fully-differential op-amp circuit in the output stage and having very high open-loop DC gain, very high unity-gain frequency, and considerably low power consumption is presented. The gain-boost amplifiers are configured as fully-differential op-amps, one being configured to be electrically connected to PMOS FET circuitry and the other being configured to be electrically connected to NMOS FET circuitry. The input stage op-amp circuit provides high gain, high input resistance, and large common mode rejection. The gain-boost op-amp circuits and the input stage form a local unity-gain feedback, and the outputs of the gain-boost op-amp circuits are adaptively stabilized. The output stage op-amp circuit provides gain, low output resistance, and minimal output loss.

8 Claims, 4 Drawing Sheets

FULLY DIFFERENTIAL TWO-STAGE OPERATIONAL AMPLIFIER WITH GAIN BOOSTING

CROSS-REFERENCE TO RELATED APPLICATION

The present application claims the benefit of co-pending U.S. provisional patent application, issued Ser. No. 60/224,602, and filed Aug. 11, 2000, which is hereby incorporated by reference in its entirety.

FIELD OF THE INVENTION

The present invention generally relates to integrated circuit ("IC") operational amplifiers. More specifically, the invention relates to differential, two-stage operational amplifiers.

BACKGROUND OF THE INVENTION

Since the development of the transistor and integrated circuits, IC operational amplifiers ("op-amps") have been used in many applications related to such fields as telecommunications, audio / video technology, and computers. Complementary metal oxide semiconductor ("CMOS") operational amplifiers are a major category of IC op-amps that are used in a variety of applications. For example, CMOS op-amps are widely applied in high performance CMOS circuits, such as high speed/high resolution pipeline analog-to-digital ("A/D") converters.

In the application of op-amps, such as CMOS op-amps, the performance of the overall circuit is typically limited by the performance capability of the op-amp(s) used in the circuit. For example, the dynamic range performance and frequency response performance of a circuit using an op-amp are generally limited based on the open-loop DC gain and unity-gain frequency of the op-amp. High performance circuits require op-amps with high open-loop DC gain and a high unity-gain frequency.

There have been continuous efforts made to develop op-amps with higher open-loop DC gain and a higher unity-gain frequency to support the development of increasingly higher performing circuits. Typically, in this regard, there are prominent trade-offs that occur in op-amp performance. For example, an increase in gain performance typically results in an undesired decrease in frequency response performance. As another example, an increase in speed/unity-gain frequency typically results in the undesired increase of power consumption.

Various op-amp designs have been developed in an attempt to meet high performance requirements while minimizing performance trade-offs. These designs include folded-cascode op-amps with gain boosting and two-stage op-amps. Designs denoted by these names are known in the art, and need not be described herein. Yet, such designs have not been shown to fulfil the increasing demand for even higher performance applications. Thus, there is a need for an operational amplifier that performs with very high open-loop DC gain while maintaining a very high unity-gain frequency, in comparison to existing designs, but without significant increase of undesired parameters.

SUMMARY OF THE INVENTION

Certain objects, advantages, and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve various objects and advantages, the present invention is directed to a novel op-amp circuit. In accordance with a preferred embodiment of the present invention, a two-stage op-amp circuit including a telescopic op-amp circuit with gain-boost amplifier circuits in the input stage and a fully-differential op-amp circuit in the output stage is provided. Furthermore, in accordance with a preferred embodiment of the present invention, the gain-boost amplifier circuits include a fully-differential P-channel metal-oxide semiconductor ("PMOS") input-stage gain-boost op-amp circuit and a fully-differential N-channel metal-oxide semiconductor ("NMOS") input-stage gain-boost op-amp circuit.

One advantage of a preferred embodiment of the present invention is that it performs with a very high open-loop DC gain in comparison to existing op-amp circuits. Another advantage of a preferred embodiment of the present invention is that its significant increase in open-loop DC gain does not result in a decrease in its unity-gain frequency, unlike the typical open-loop DC gain/unity-gain frequency tradeoff that occurs in existing op-amp circuits. That is, a preferred embodiment of the present invention performs with a very high open-loop DC gain while also maintaining a very high unity-gain frequency. Yet another advantage of a preferred embodiment of the present invention is that it has a significantly small increase in undesirable operation parameters, such as power consumption, considering its significant increase in desirable operation parameters such as open-loop DC gain and unity-gain frequency.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the detailed description given below and from the accompanying drawings of a preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION OF THE PREFERRED EMBODIMENTS

Figure 1:
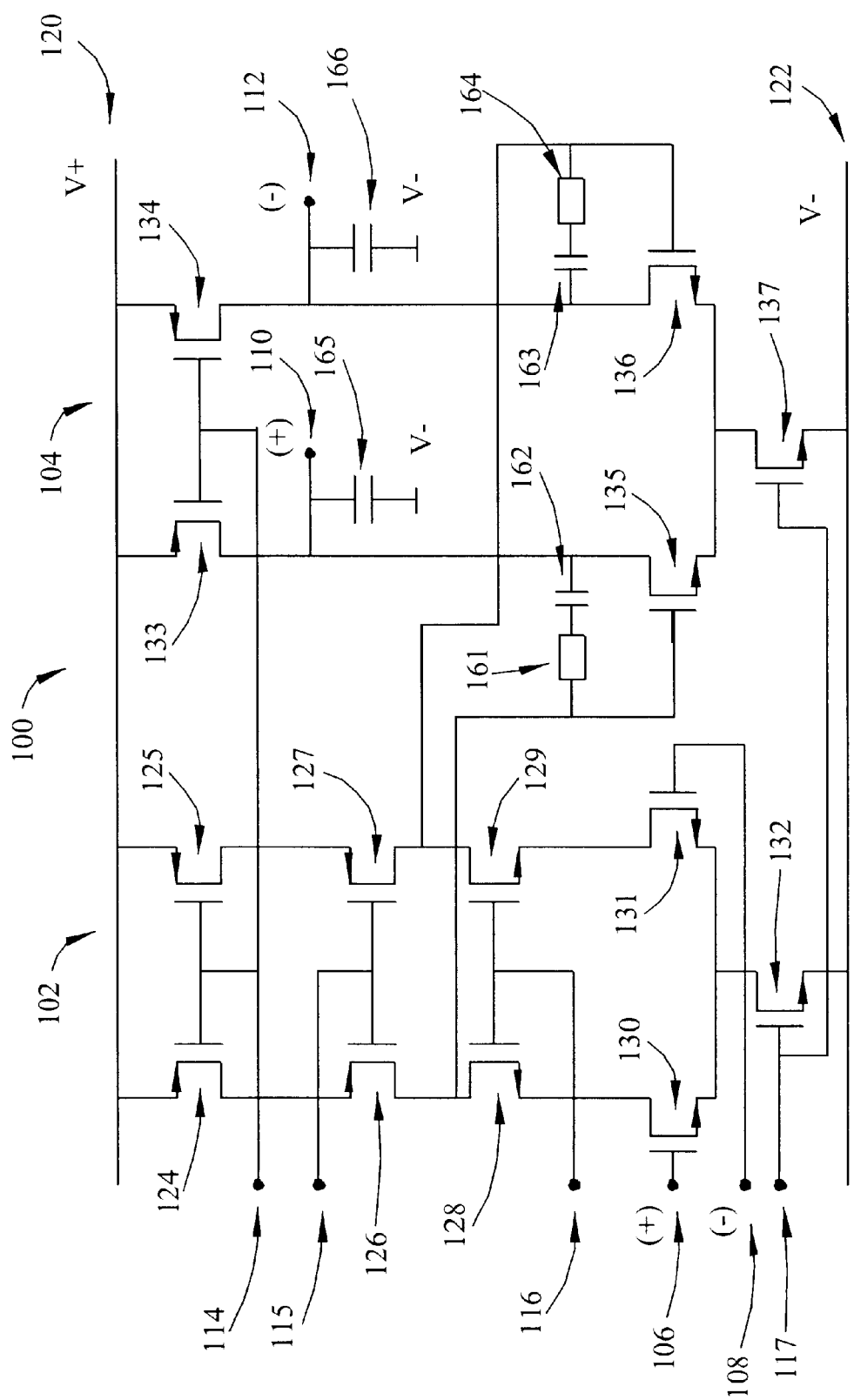
FIG. 1 is a circuit diagram illustrating a conventional two-stage op-amp using a telescopic op-amp circuit in the input stage and a fully-differential op-amp circuit in the output stage, as is known in the prior art.

Having summarized the invention above, reference is now made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims. Indeed, the present invention is believed to be applicable to a variety of systems, devices, and technologies.

Turning now to the drawings, wherein like referenced numerals designate corresponding parts throughout the drawings, FIG. 1 shows a conventional two-stage op-amp circuit 100, as is known in the prior art. Such a circuit includes a positive (i.e., noninverting) input 106 and a negative (i.e., inverting) input 108 electrically connected to the first stage 102. A positive (i.e., noninverting) output 110 and a negative (i.e., inverting) output 112 are electrically connected to the second stage 104 of such a circuit and a load capacitor (165, 166) is electrically connected to each of these outputs.

The first stage 102 of the op-amp 100 consists of what is commonly referred to in the art as a telescopic op-amp configuration, which is made up of a plurality of metal-oxide semiconductor field-effect transistors ("MOSFET's") (124–132) that are electrically connected. The first stage 102 functions to provide gain, that is to amplify the input signal, and also to provide high input resistance and large common mode rejection. The second stage 104 of the op-amp 100 consist of what is commonly referred to in the art as a fully-differential op-amp configuration, which is made up of a plurality of MOSFET's (133–137) that are electrically connected, as shown. The second stage 104 functions to also provide gain and to provide a low output resistance and minimal output signal loss. Electrically interconnecting the first stage 102 and the second stage 104 are coupling resistors (161, 164) and coupling capacitors (162, 163).

The op-amp 100 is powered from a positive voltage power rail 120 and a negative voltage power rail 122. Additionally, various members (124–129, 132–134, 137) of the plurality of MOSFET's, which make up the two stages (102, 104) of the op-amp circuit 100, are biased via bias inputs (114–117). Essentially, the conventional op-amp circuit 100 operates to output an amplified version of an input signal that has a frequency within the operating bandwidth of the op-amp 100. The op-amp 100 utilizes Miller compensation to maintain stability, as is known in the art.

Having described a conventional two-stage op-amp circuit, as is known in the prior art, reference now will be made to various embodiments of a fully-differential two-stage op-amp with gain-boosting in the first stage, constructed in accordance with various aspects of the present invention. To this end, reference is first made to FIG. 2, which shows a circuit diagram of a two-stage op-amp 200 using a telescopic op-amp with gain-boost amplifiers in the input stage, in accordance with a preferred embodiment of the present invention. Where appropriate, reference numerals have been kept the same as those illustrated in connection with FIG. 1 to emphasize the differences in a preferred embodiment of the present invention from the prior art circuit.

Figure 2:
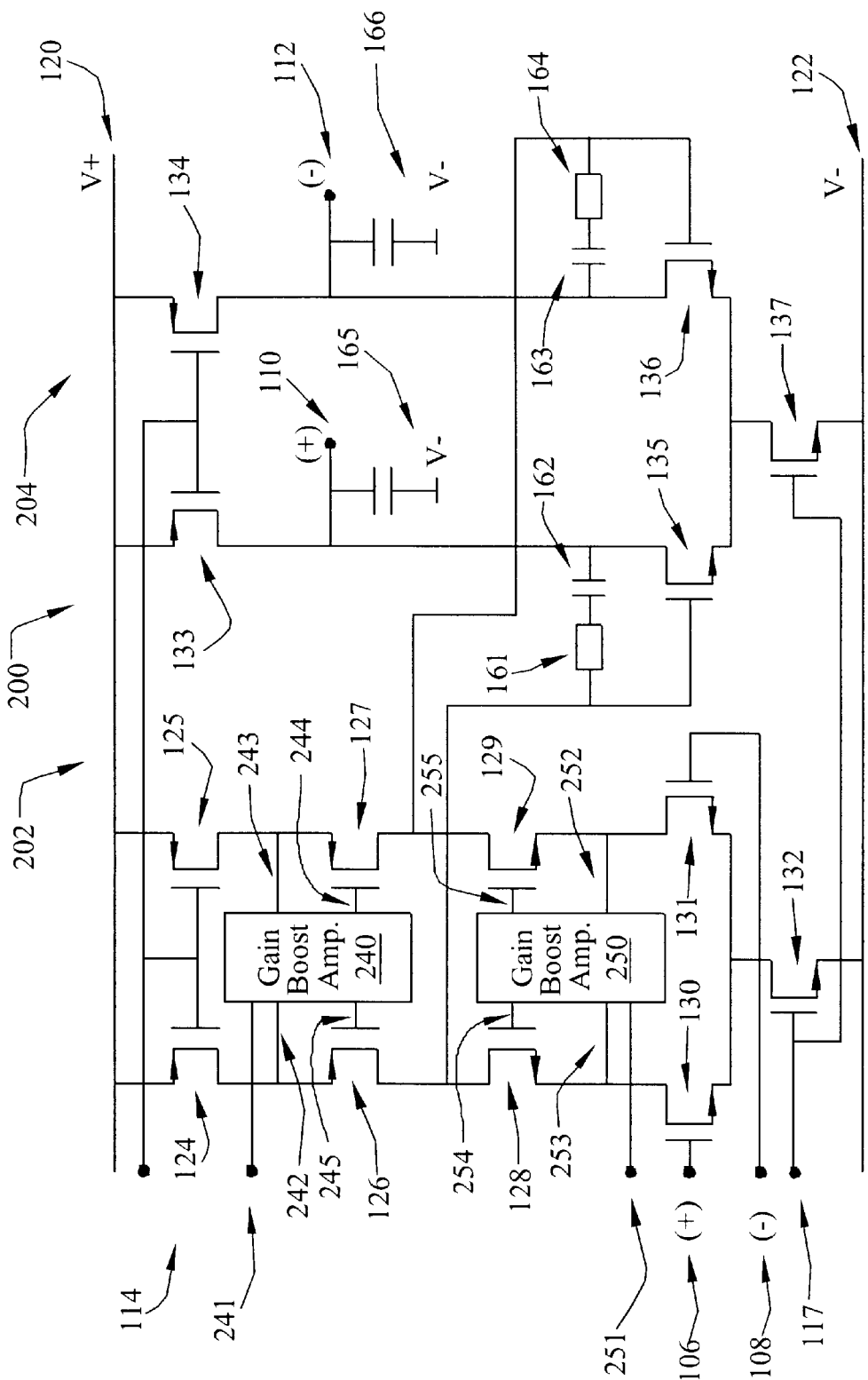
FIG. 2 is a circuit diagram of a two-stage op-amp using a telescopic op-amp circuit with gain-boost amplifier circuits in the input stage and a fully-differential op-amp circuit in the output stage, in accordance with a preferred embodiment of the present invention.

Referring to FIG. 2, the op-amp 200 of the present invention comprises a positive input 106 and a negative input 108 which are electrically connected to an input stage 202. The op-amp 200 also comprises a positive output 110 and a negative output 112 which are electrically connected to an output stage 204. In a preferred embodiment, as shown in FIG. 2, each output (110, 112) is also electrically connected to a load capacitor (165, 166), although in other embodiments, these load capacitors may not be included. An input or output, as it is referred to in the present invention, may include but is not limited to any thing that may be used as an electrical connector or connection, for example, a terminal, pin, contact, lead, or solder point. The input stage 202 and output stage 204 are electrically coupled, and in a preferred embodiment, as shown in FIG. 2, the input stage 202 and the output stage 204 are electrically interconnected by circuits that each have a coupling resistor (161, 164) and a coupling capacitor (162, 163). Additionally, the op-amp 200 is powered from a positive voltage power rail 120 and a negative voltage power rail 122.

The input stage 202 comprises a plurality of MOSFET's (124–132) that are electrically connected in what is commonly referred to in the art as a telescopic op-amp configuration. The output stage 204 comprises a plurality of MOSFET's (133–137) that are electrically connected in what is commonly referred to in the art as a fully-differential op-amp configuration. In contrast to the conventional op-amp 100 (FIG. 1), the op-amp 200 of the present invention (FIG. 2) has members (124–125, 132–134, 137) of the plurality of MOSFET's of the input and output stages (202, 204) that are electrically connected to and biased through bias inputs (114, 117). Further, and in significant contrast to the conventional op-amp 100 (FIG. 1), the op-amp 200 of the present invention (FIG. 2) has other members (126–129) of the plurality of MOSFET's that are electrically connected to and biased by input-stage gain-boost amplifiers (240, 250), and the inclusion of the gain-boost amplifiers (240, 250) also represents a significant difference from the conventional op-amp 100.

The gain-boost amplifiers (240, 250) are electrically connected to the input stage 202 by a plurality of connections (242–245, 252–255), which comprise positive and negative inputs (242–243, 252–253) and positive and negative outputs (244–245, 254–255) of the gain-boost amplifiers (240, 250). The gain-boost amplifiers (240, 250) and the input stage 202 form a local unity-gain feedback. Therefore, the outputs (244–245, 254–255) of the gain-boost amplifiers (240, 250) are adaptively stabilized. As a result of these characteristics, several notable benefits, among others, are achieved. First, the open-loop DC gain of the op-amp 200 (FIG. 2) is significantly increased over that of the conventional op-amp 100 (FIG. 1). Second, the op-amp 200 achieves this significant increase in open-loop DC gain without a resultant decrease in its unity-gain frequency, unlike in the conventional op-amp 100 which typically incurs a decrease in unity-gain frequency for an attempted increase in open-loop DC gain. Third, the op-amp 200 achieves very high open-loop DC gain and maintains very high unity-gain frequency with only a small increase in power consumption, and the circuit requires little additional area in the overall CMOS circuit layout. In a preferred embodiment of the present invention, the gain-boost amplifier 240 is configured to electrically connect to P-channel MOSFET circuitry of the input stage 202 and is therefore referred to as a PMOS gain-boost amplifier. Furthermore, in a preferred embodiment of the present invention, the other gain-boost amplifier 250 is configured to electrically connect to N-channel MOSFET circuitry of the input stage and is therefore referred to as an NMOS gain-boost amplifier.

It is noted that the input stage 202 functions to provide high gain and also to provide high input resistance and large common mode rejection. Furthermore, the output stage 204 functions to provide additional gain and to provide a low output resistance and minimal output signal loss.

Figure 3:
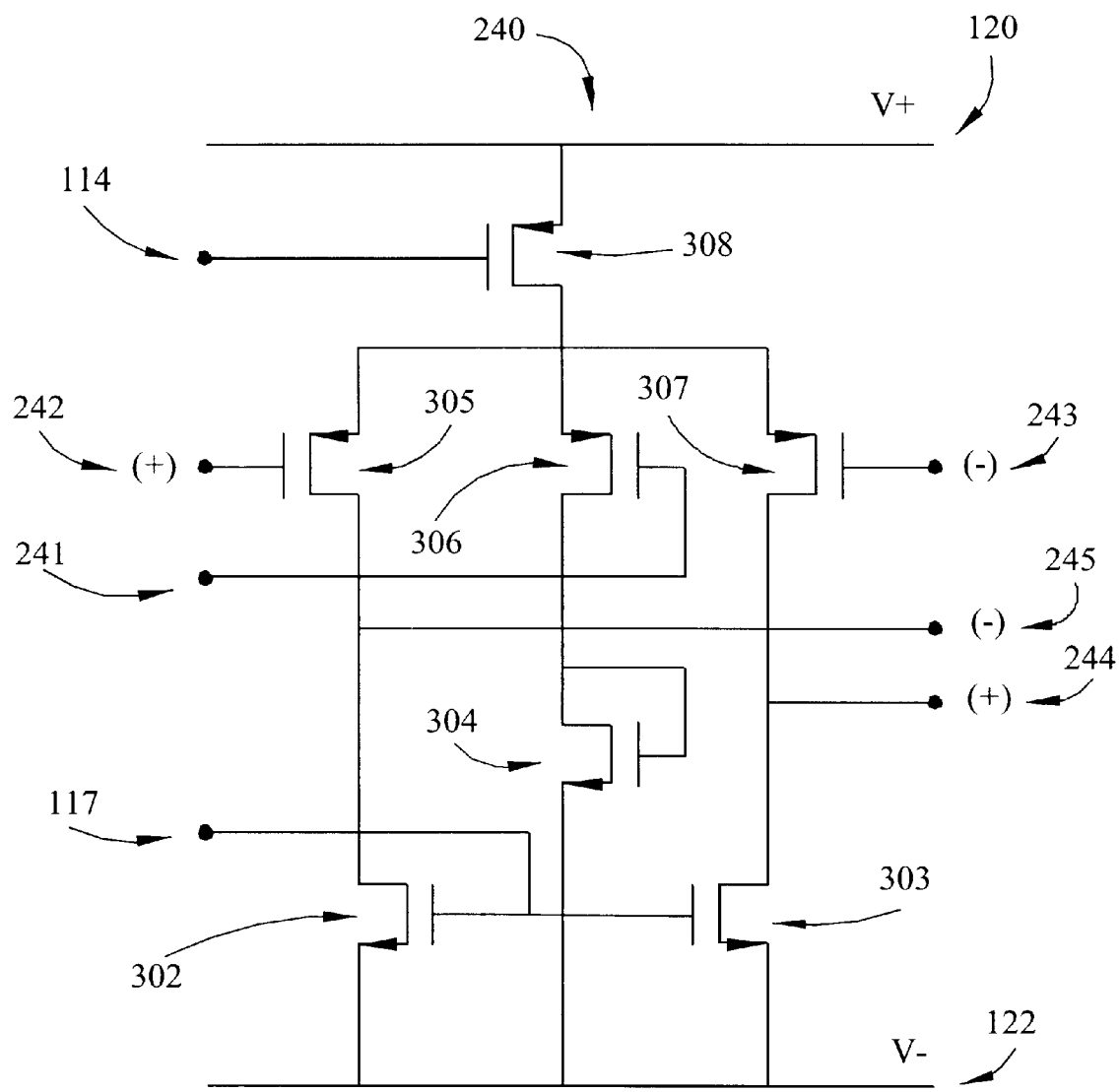
FIG. 3 is a circuit diagram of a PMOS input-stage gain-boost op-amp in accordance with a preferred embodiment of the present invention as depicted in FIG. 2.

Reference is now directed to FIG. 3, which shows a circuit diagram of a PMOS input-stage gain-boost amplifier 240, as briefly referenced to above, in accordance with a preferred embodiment of the present invention. The PMOS gain-boost amplifier 240 comprises a plurality of electrically connected MOSFET's (302–308), various members (302–303, 306, 308) of which are electrically connected to and biased via bias inputs (114, 117, 241). The PMOS gain-boost amplifier 240 has what is commonly referred to in the art as a fully-differential op-amp configuration. In such a configuration, a positive input 242, a negative input 243, a positive output 244, and a negative output 245 are each electrically connected to the PMOS gain-boost amplifier 240. Furthermore, the PMOS gain-boost amplifier 240 is electrically connected to and powered from a positive voltage power rail 120 and a negative voltage power rail 122.

Figure 4:
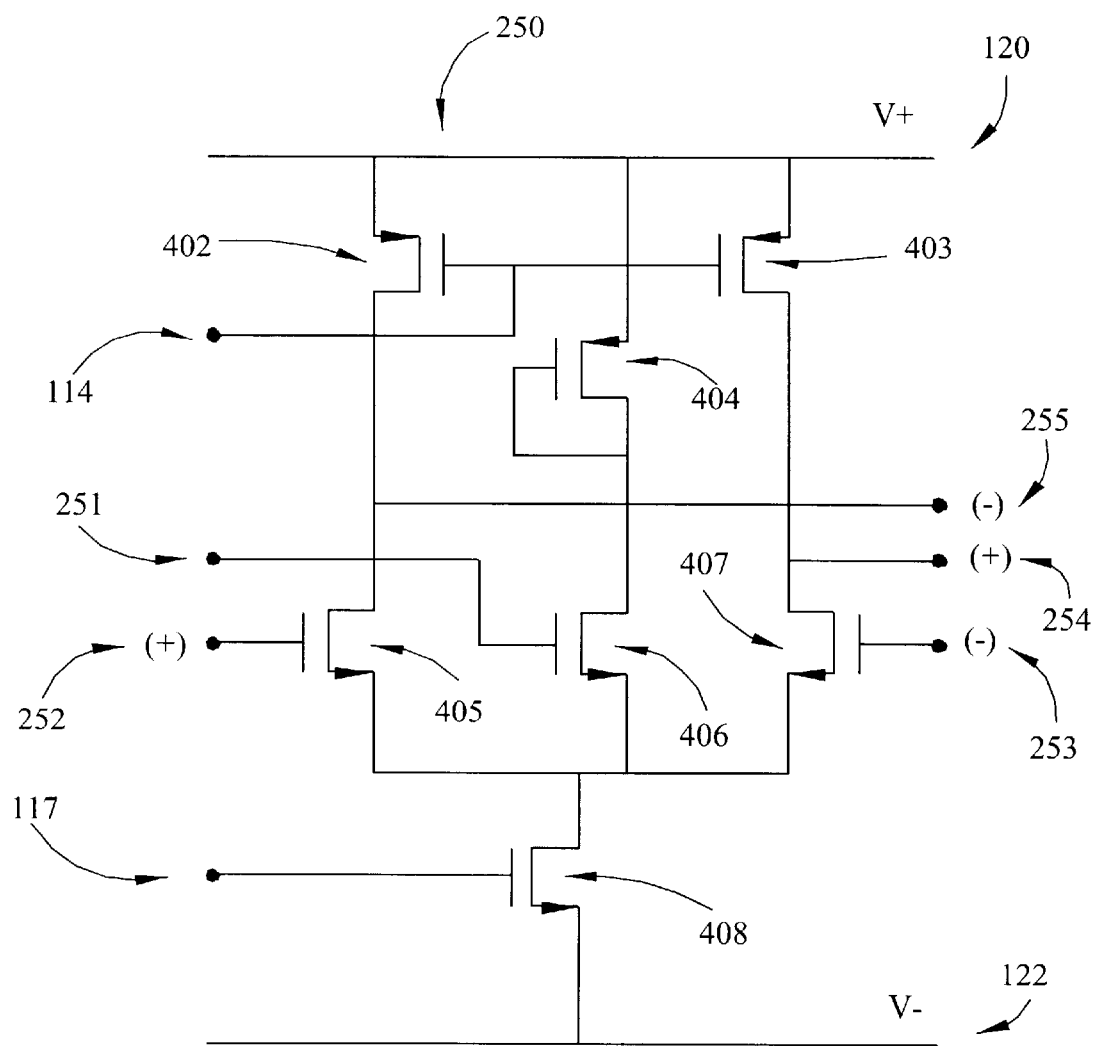
FIG. 4 is a circuit diagram of an NMOS input-stage gain-boost op-amp in accordance with a preferred embodiment of the present invention as depicted in FIG. 2.

Moving now to FIG. 4, a circuit diagram is shown of an NMOS input-stage gain-boost amplifier 250, as briefly referenced to above, in accordance with a preferred embodiment of the present invention. The NMOS gain-boost amplifier 250 is a counterpart to the PMOS gain-boost amplifier 240 (FIG. 3), the difference being that the prior is configured for connection to P-channel MOSFET circuitry of the input stage 202 (FIG. 2) while the latter is configured for connection to N-channel MOSFET circuitry of the input stage 202. As such, the NMOS gain-boost amplifier includes a plurality of electrically connected MOSFET's (402–408) with various members (402–403, 406, 408) of this plurality electrically connected to and biased via bias inputs (114, 117, 251). The NMOS gain-boost amplifier 250 is also configured as a fully-differential op-amp, as such configuration is commonly referred to in the art, and it has a positive input 252, a negative input 253, a positive output 254, and a negative output 255 electrically connected to it. Finally, the NMOS gain-boost amplifier 250 is electrically connected to and powered from a positive voltage power rail 120 and a negative voltage power rail 122.

The following is also noted with respect to the gain-boost amplifiers (240, 250). First, in a preferred embodiment, as shown in FIG. 3 and FIG. 4, two of the bias inputs (114, 117) are common to each gain-boost amplifier (240, 250) and the input and output stages (202, 204), although in other embodiments, the bias inputs (114, 117) may not be common to the gain-boost amplifiers (240, 250) and the input and output stages (202, 204). Second, in a preferred embodiment, as shown in FIG. 3 and FIG. 4, the voltage power rails (120, 122) are common to each gain-boost amplifier (240, 250) and the input and output stages (202, 204), although in other embodiments, the voltage power rails (120, 122) may not be common to the gain-boost amplifiers (240, 250) and the input and output stages (202, 204).

It is emphasized that the above-described embodiments of the present invention, particularly any "preferred" embodiments, are merely possible examples of the implementations that are merely set forth for a clear understanding of the principles of the invention. It will be apparent to those skilled in the art that many modifications and variations may be made to the above-disclosed embodiments of the present invention without departing substantially from the spirit and principles of the invention. All such modifications and variations are intended to be included herein within the scope of the disclosure and present invention and protected by the following claims.

Therefore, having thus described the invention, at least the following is claimed:

1. An operational amplifier comprising:

an input stage comprising a first plurality of P-channel and N-channel metal-oxide semiconductor field-effect transistors electrically connected in a telescopic operational amplifier configuration;

a positive input electrically connected to the input stage;

a negative input electrically connected to the input stage;

a first amplifier electrically connected to the input stage, wherein the first amplifier is configured to be electrically connected to P-channel metal-oxide semiconductor field-effect transistors and comprises:

a first amplifier stage comprising a second plurality of P-channel and N-channel metal-oxide semiconductor field-effect transistors electrically connected in a first fully-differential operational amplifier configuration;

a positive input electrically connected to the first amplifier stage;

a negative input electrically connected to the first amplifier stage;

a positive output electrically connected to the first amplifier stage;

a negative output electrically connected to the first amplifier stage; and a first bias input electrically connected to the first amplifier stage;

a second amplifier electrically connected to the input stage, wherein the second amplifier is configured to be electrically connected to N-channel metal-oxide semiconductor field-effect transistors and comprises:

a second amplifier stage comprising a third plurality of P-channel and N-channel metal-oxide semiconductor field-effect transistors electrically connected in a second fully-differential operational amplifier configuration;

a positive input electrically connected to the second amplifier stage;

a negative input electrically connected to the second amplifier stage;

a positive output electrically connected to the second amplifier stage;

a negative output electrically connected to the second amplifier stage; and a second bias input electrically connected to the second amplifier stage;

a first series circuit comprising a first coupling resistor and a first coupling capacitor electrically connected to the input stage;

a second series circuit comprising a second coupling resistor and a second coupling capacitor electrically connected to the input stage;

an output stage electrically connected to the first series circuit and to the second series circuit comprising a fourth plurality of P-channel and N-channel metal-oxide semiconductor field-effect transistors electrically connected in a third fully-differential operational amplifier configuration;

a positive output electrically connected to the output stage, wherein a first load capacitor is electrically connected to the positive output;

a negative output electrically connected to the output stage, wherein a second load capacitor is electrically connected to the negative output; and a plurality of bias inputs electrically connected to the input stage, the output stage, the first amplifier, and the second amplifier.

2. An operational amplifier comprising:

an input stage comprising a first plurality of metal-oxide semiconductor field-effect transistors electrically connected, wherein the first plurality of transistors are configured in a telescopic operational amplifier configuration;

an output stage electrically coupled to the input stage and comprising a second plurality of metal-oxide semiconductor field-effect transistors electrically connected, wherein the second plurality of transistors are configured in a first fully-differential operational amplifier configuration;

a first gain-boost amplifier electrically connected to the input stage and comprising a third plurality of metal-oxide semiconductor field-effect transistors electrically connected, wherein the third plurality of transistors are configured in a second fully-differential operational amplifier configuration; and a second gain-boost amplifier electrically connected to the input stage and comprising a fourth plurality of metal-oxide semiconductor field-effect transistors electrically connected, wherein the fourth plurality of transistors are configured in a third fully-differential operational amplifier configuration.

3. The operational amplifier of claim 2 wherein the first gain-boost amplifier is configured to be electrically connected to P-channel metal-oxide semiconductor field-effect transistors and the second gain-boost amplifier is configured to be electrically connected to N-channel metal-oxide semiconductor field-effect transistors.

4. The operational amplifier of claim 2 wherein the output stage is electrically coupled to the input stage by a first circuit comprising a first coupling resistor and a first coupling capacitor and by a second circuit comprising a second coupling resistor and a second coupling capacitor.

5. The operational amplifier of claim 2 wherein a positive input and a negative input are electrically connected to the input stage, a positive output having a first load capacitor and a negative output having a second load capacitor are electrically connected to the output stage, a first bias input is electrically connected to the first gain-boost amplifier, a second bias input is electrically connected to the second gain-boost amplifier, and a plurality of bias inputs are electrically connected to the input stage, the output stage, the first gain-boost amplifier, and the second gain-boost amplifier.

6. A method for providing an operational amplifier having a very high open-loop DC gain, a very high unity-gain frequency, and a relatively low power consumption comprising the steps of:

providing an input stage comprising a first plurality of metal-oxide semiconductor field-effect transistors configured in a telescopic operational amplifier configuration and having high gain, high input resistance, and large common mode rejection;

providing an output stage electrically coupled to the input stage comprising a second plurality of metal-oxide semiconductor field-effect transistors configured in a first fully-differential operational amplifier configuration and having gain, low output resistance, and a minimal output loss characteristic;

providing a first gain-boost amplifier electrically connected to the input stage comprising a third plurality of metal-oxide semiconductor field-effect transistors configured in a second fully-differential operational amplifier configuration, forming a local unity-gain feedback along with the input stage, and having adaptively stabilized outputs; and providing a second gain-boost amplifier electrically connected to the input stage comprising a fourth plurality of metal-oxide semiconductor field-effect transistors configured in a third fully-differential operational amplifier configuration, forming a local unity-gain feedback along with the input stage, and having adaptively stabilized outputs.

7. The method of claim 6, wherein:

the step of providing the first gain-boost amplifier further comprises configuring the first gain-boost amplifier to be electrically connected to P-channel metal-oxide semiconductor field-effect transistors; and the step of providing the second gain-boost amplifier further comprises configuring the second gain-boost amplifier to be electrically connected to N-channel metal-oxide semiconductor field-effect transistors.

8. The method of claim 6, further comprising the step of coupling the output stage to the input stage through a first circuit comprising a first coupling resistor and a first coupling capacitor and through a second circuit comprising a second coupling resistor and a second coupling capacitor.

* * * * *